US008755191B2

(12) United States Patent
Riebel (10) Patent No.: US 8,755,191 B2
(45) Date of Patent: Jun. 17, 2014

(54) SERVER FRAME AND RACK-MOUNTED SERVER SUITABLE FOR USE IN THE SERVER FRAME

(75) Inventor: Michael Riebel, Kissing (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 313 days.

(21) Appl. No.: 13/275,429

(22) Filed: Oct. 18, 2011

(65) Prior Publication Data

US 2012/0050986 A1 Mar. 1, 2012

Related U.S. Application Data

(63) Continuation of application No. PCT/EP2010/050938, filed on Jan. 27, 2010.

(30) Foreign Application Priority Data

May 8, 2009 (DE) .......................... 10 2009 020 390

(51) Int. Cl.
*H05K 5/00* (2006.01)

(52) U.S. Cl.
USPC ...... 361/733; 361/679.38; 361/732; 361/759; 361/802; 439/43; 710/301

(58) Field of Classification Search
USPC .......... 361/676–678, 679.33, 679.37, 679.38, 361/679.39, 724, 733, 679.46–679.54, 361/688–722, 752, 796, 798, 801–802, 831
See application file for complete search history.

(56) References Cited

U.S. PATENT DOCUMENTS

| | | | |
|---|---|---|---|
| 5,214,572 A * | 5/1993 | Cosimano et al. ............ 361/802 |
| 5,325,269 A | 6/1994 | Someno | |
| 6,459,571 B1 | 10/2002 | Carteau | |
| 6,826,456 B1 | 11/2004 | Irving et al. | |
| 6,950,895 B2 | 9/2005 | Bottom | |
| 7,350,090 B2 | 3/2008 | Baurer et al. | |
| 7,679,933 B2 * | 3/2010 | Makabe ......................... 361/801 |
| 8,289,710 B2 * | 10/2012 | Spearing et al. .............. 361/701 |
| 2003/0030993 A1 * | 2/2003 | Kitchen et al. ................ 361/726 |
| 2004/0158771 A1 | 8/2004 | Garnett et al. | |
| 2004/0165358 A1 | 8/2004 | Regimbal et al. | |
| 2004/0165366 A1 * | 8/2004 | Schnabel et al. .............. 361/796 |
| 2006/0126292 A1 * | 6/2006 | Pfahnl et al. .................. 361/695 |
| 2007/0035933 A1 * | 2/2007 | Chuang ......................... 361/752 |
| 2007/0091559 A1 * | 4/2007 | Malone ......................... 361/685 |
| 2008/0046617 A1 | 2/2008 | Lee et al. | |
| 2009/0059520 A1 * | 3/2009 | Tanaka et al. ................. 361/692 |

\* cited by examiner

*Primary Examiner* — Courtney Smith
(74) *Attorney, Agent, or Firm* — DLA Piper LLP (US)

(57) ABSTRACT

A server system includes at least one blade server, wherein the blade server has at least one processor and memory modules, as well as a plug connector on an upper side or an underside of the blade server, a server frame with an opening on a first side of the server frame for accommodating the at least one blade server, wherein the server frame includes guidance means and a circuit board and a lifting device for guiding the at least one blade server in the lifting direction up to the circuit board, and at least one cooling fan assembly arranged inside the server frame.

18 Claims, 5 Drawing Sheets

Prior Art

FIG 5

SERVER FRAME AND RACK-MOUNTED SERVER SUITABLE FOR USE IN THE SERVER FRAME

RELATED APPLICATION

This is a continuation of International Application No. PCT/EP2010/050938, with an international filing date of Jan. 27, 2010 (WO 2010/127882, published Nov. 11, 2010), which is based on German Patent Application No. 10 2009 020 390.7, filed May 8, 2009, the subject matter of which is incorporated by reference.

TECHNICAL FIELD

This disclosure relates to a server frame for holding rack-mounted servers, in which frame a circuit board is provided for contacting inserted rack-mounted servers. The disclosure further relates to a rack-mounted server for use in the server frame.

BACKGROUND

A server system generally comprises a plurality of servers inserted in the form of rack-mounted modules into one or more server frames. Several server frames can in turn be installed in server racks. The servers generally comprise one or more processors (CPUs) and memory modules and, optionally, hard drive storage units. In a thin design, such servers typically mounted in the server frame one next another vertically, are also called "blade" servers. Additional components required for operation such as power supplies (power adapters) and terminal strips for the network connections are usually provided in additional connection modules or other modules arranged in the server frame and are jointly used by the servers. A circuit board with suitable terminals is frequently used for electrical connections between the servers and the connection modules.

Figure 3:
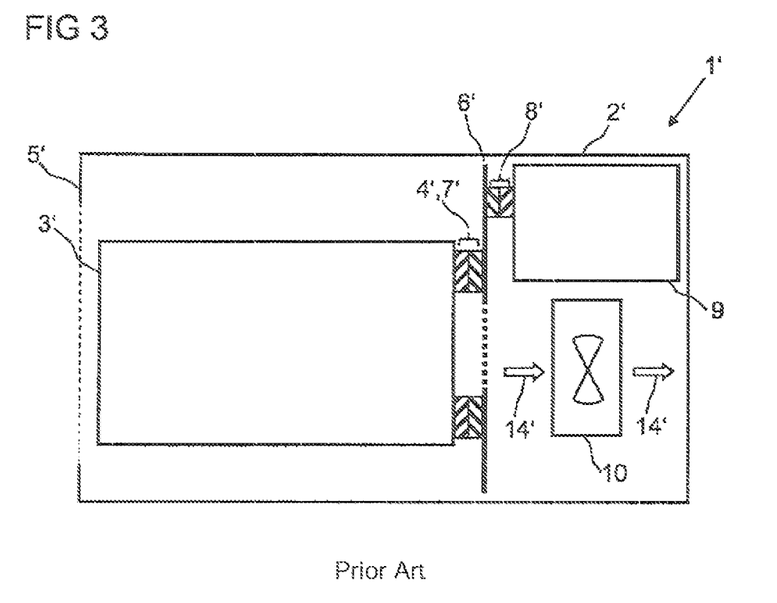
FIG. 3 shows a schematic sectional view of a known server frame.

The circuit board is typically arranged vertically in the center of the server system and is therefore referred to as a midplane. It has two sides, each with a plurality of terminals in the form of plug connectors (plugs and/or sockets). The rack-mounted servers are inserted from one side of the midplane and the various connection modules are inserted from the other side and thus electrically connected to the midplane, as illustrated in FIG. 3, which shows a known server system. Consequently, an electrical connection between the rack-mounted servers and the connection modules is produced by the midplane, and both a transfer of data from and to the rack-mounted servers and a power supply for the rack-mounted servers are ensured.

To cool the rack-mounted servers, a cooling fan arrangement is frequently provided inside the server frame as an additional module, which draws in cooling air through the servers or blows it through the servers from the rear side of the server frame by several fan modules arranged one next to another in the longitudinal direction. The rack-mounted servers have corresponding air inlets and outlets on their front and rear sides. The midplane vertically arranged directly behind the rack-mounted servers perpendicular to the longitudinal direction, however, represents a high flow resistance for the cooling air stream (illustrated by arrows 14' in FIG. 3). The cooling air stream is severely hindered in this way so that only a reduced cooling power is available for the rack-mounted servers.

To keep the flow resistance due to the midplane as small as possible, the midplane is typically provided with holes, which is only possible to a limited extent, however, since the surface of the midplane is required for conductor traces, plugs and sockets. As a rule, high-powered and therefore noisy, expensive and energy-intensive fans must be used to overcome the remaining flow resistance.

It could therefore be helpful to create a server frame in which sufficient cooling of the rack-mounted servers is possible in a simple and cost-effective manner and to create a rack-mounted server suitable for the server frame.

SUMMARY

I provide a server system having at least one blade server, wherein the blade server has at least one processor and memory modules, as well as a plug connector on an upper side or an underside of the blade server, a server frame with an opening on a first side of the server frame for accommodating the at least one blade server, wherein the first side is spanned by a first direction and a lifting direction perpendicular to the first direction, wherein the server frame includes guidance means for fixing the at least one blade server in the first direction and for guiding the at least one blade server up to a predetermined position in an insertion direction perpendicular to the first side of the server frame, a circuit board for contacting the at least one blade server inserted from the first side of the server frame in the insertion direction, wherein the circuit board is arranged perpendicular to the lifting direction and has at least one plug connector that is complementary to the plug connector of the blade server, and wherein the plug connector of the blade server and the plug connector of the circuit board frame one another at the predetermined position in the insertion direction and in the first direction, and a lifting device for guiding the at least one blade server in the lifting direction up to the circuit board, and at least one cooling fan assembly arranged inside the server frame that is set up to blow or draw in cooling air in the insertion direction through the at least one blade server.

I also provide a blade server for insertion into the server system with a server frame, wherein the blade server includes at least one processor and memory modules, ventilation gratings on a front side and a rear side of the blade server for drawing in or blowing cooling air through the blade server in an insertion direction of the blade server in the server system, and at least one plug connector on an upper side or an underside of the blade server arranged parallel to an insertion direction for electrical contacting with a complementary plug connector of a circuit board of a server frame.

I further provide a server frame having guidance means for fixing at least one blade server in a first direction parallel to a first side of the server frame and for guiding the at least one blade server up to a predetermined position in an insertion direction perpendicular to the first side of the server frame, a circuit board for contacting the at least one blade server inserted in the insertion direction from the first side of the server frame, wherein the circuit board is arranged in a plane spanned by the first direction and the insertion direction, and at least one plug connector complementary to a plug connector of the at least one blade server and arranged on the circuit board in such a manner that the plug connector of the blade server and the plug connector of the circuit board face one another at the predetermined position in the insertion direction, and a lifting device for guiding the at least one blade server up to the circuit board in a lifting direction orthogonal to the insertion direction and the first direction.

LIST OF REFERENCE NUMBERS

1 Server system
2 Server frame
3 Rack-mounted server
4 Plug connector
5 First side
6 Circuit board
7 Plug connector
8 Plug connection
9 Connection module
10 Fan module
11 Guidance means
12 Lifting device
13 Operating element
14 Cooling air stream
x Direction
y Another direction, lifting direction
z Insertion direction

DETAILED DESCRIPTION

I provide a server frame for holding rack-mounted servers that has a circuit board used for contacting at least one of the servers inserted from a first side of the server frame in a direction perpendicular to the first side, wherein at least one cooling fan arrangement, which blows cooling air in the insertion direction through the rack-mounted servers or draws it through them, is provided inside the server frame. The circuit board is arranged perpendicular to the first side and parallel to the insertion direction.

By arranging the circuit board parallel to the insertion direction and perpendicular to the first side of the server rack, from which or through which the rack-mounted modules are inserted, the circuit board is parallel to the coolant stream running parallel to the insertion direction. Consequently, the coolant stream can flow unhindered through the server frame and the rack-mounted servers. The use of high-powered, expensive and energy-intensive fans can be eliminated and energy and costs can be saved.

Preferably, guidance means are provided that guide a rack-mounted server to be inserted up to a predetermined position in the insertion direction. This ensures that the rack-mounted module occupies a position suitable for contacting the circuit board in the server frame.

Preferably, a lifting device is provided to move a rack-mounted server up to the circuit board in a lifting direction perpendicular to the insertion direction. The rack-mounted server can thus be contacted by the circuit board in a simple manner.

Further preferably, a separation device is provided to move a rack-mounted server away from the circuit board and breaking a connection between the plug connectors of an inserted rack-mounted server and the circuit board. The connection between the insertion module and the circuit board can thus be detached quickly and easily for maintenance purposes, for instance. It is particularly preferred that the guidance means fix an inserted rack-mounted server in the lifting direction and the lifting device is set up so that it also serves as a separation device.

Preferably, blade servers are used as rack-mounted servers.

I also provide a rack-mounted server having, on a side surface arranged parallel to an insertion direction, at least one plug connector for electrical contact with a complementary plug connector of a circuit board in the server frame. In a rack-mounted server constructed in this manner, it is possible to forgo a circuit board perpendicular to the insertion direction for contacting and thereby easily build up a cooling air stream that is unhindered in the insertion direction.

Preferably, the plug connector is arranged on an upper side or an underside of the rack-mounted server. Further preferably, the rack-mounted server is configured as a blade server.

My server frames and rack-mounted servers will be described in more detail below with reference to examples and with reference to the drawings.

Figure 1:
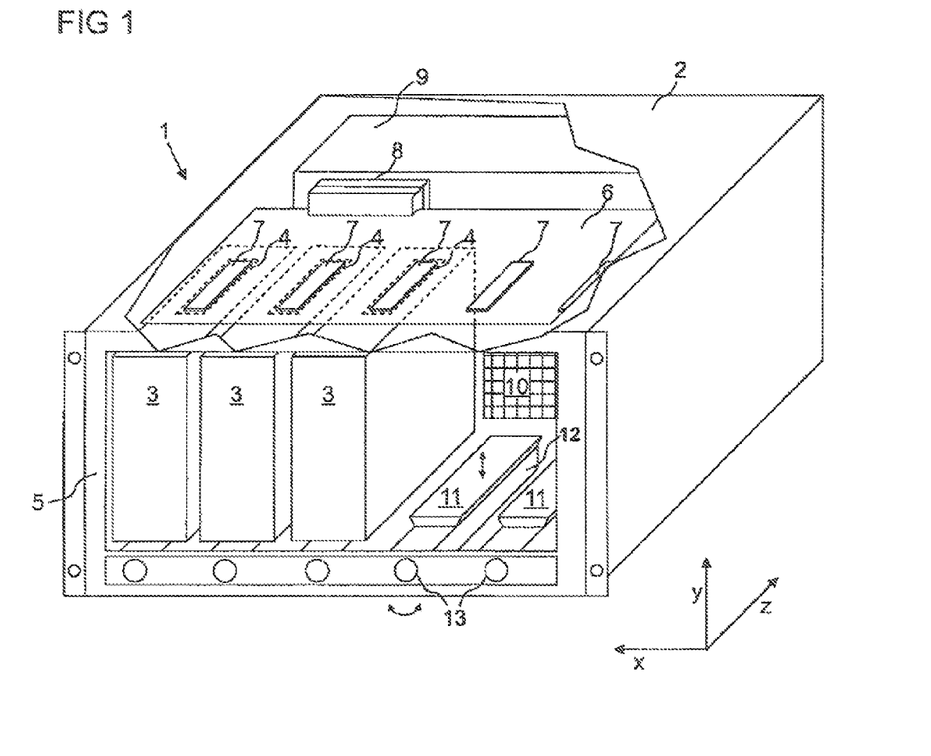
FIG. 1 shows a schematic perspective representation of a server frame with rack-mounted servers in a first example.

FIG. 1 shows a server system 1 in a schematic perspective representation. The server system 1 comprises a server frame 2 and a plurality of rack-mounted servers 3 inserted into three of a total of five insertion spaces of the server frame 2. The rack-mounted servers 3 have plug connectors 4 to make electrical contact. The server frame 2 has a first side 5 with an opening into which the rack-mounted servers 3 are inserted in an insertion direction z. The first side 5 runs in a plane, spanned by the direction x and the direction y, that is perpendicular to the insertion direction z. A circuit board 6 in a plane spanned by the insertion direction z and the direction x above the insertion spaces for the rack-mounted servers 3 is provided in the server frame 2. The circuit board 6 has plug connectors 7 complementary to the plug connectors 4 of the rack-mounted servers 3. A plug connection 8, by means of which the circuit 6 is connected to a connection module 9, is also provided. Fan modules 10 arranged in the z direction behind the insertion spaces are also provided in the server frame 2. Guidance means 11 and a lifting device 12 coupled to an operating element 13 accessible from the front side 5 are provided for each insertion space.

In the example of FIG. 1, the server system 1 is configured as a blade server system in which the rack-mounted servers 3 are blade servers. In such a system, one or more server frames 2, each intended to hold several blade servers, are usually provided and are in turn typically installed in 19" server racks or server cabinets. The five insertion spaces in the server frame 2 shown are merely an example of the number of spaces.

The rack-mounted servers 3 are inserted into the server frame 2 in the illustrated configuration from the first side 5 of the server frame 2. The rack-mounted servers 3 will be referred to below as servers 3 for the sake of brevity, and the first side 5 will be referred to as front side 5. The direction in which the rack-mounted servers 3 are inserted into the server frame 2 will be referred to as the insertion direction z. As is also indicated in the lower right portion of FIG. 1, the directions x and y in the example run perpendicular to the insertion direction z, with the server frame 2 running in its depth direction in the insertion direction z, in the x direction in its width, and in the y direction in its height. Planes will be referred to below with reference to the directions spanning them. The front side 5 thus extends in the xy plane.

To facilitate insertion of the rack-mounted servers 3 into the server frame 2, a guide or guidance means 11 is provided at each insertion space, which fixes the inserted server 3 in at least the x direction and thus allows guided insertion in the insertion direction z. In the example shown, a tongue-and-groove guide is provided as the guidance means 11, wherein a dovetail tongue is arranged on the lifting device 12 and a correspondingly shaped groove is situated in the underside of the server 3. The tongues and grooves are not constructed over the entire depth of the installation spaces, or of the server 3, so that the front side visible in the two right-hand insertion spaces constitutes a stop which allows insertion only up to a predetermined position in the insertion direction z. The predetermined position is also adapted to the position of the plug connectors 4 and 7, as will be described further in connection with FIG. 2. Other configurations of the guidance means 11 are likewise possible. For example, a U-shaped guide rail into which the server 3 is inserted is possible. Inward-facing elements that engage in a lateral groove running along the z direction on the server 3 can also be provided in the sides of the guide rail. In this manner, a server 3 is fixed in the U-shaped guide rail not only in the x direction, but also in the positive and negative y directions, as for the tongue and groove guide.

Each of the insertion possibilities of the server frame 2 is also provided with a lifting device 12 coupled to the operating element 13. If the operating element 13, constructed in the illustrated example as a rotary knob, is actuated, the lifting device is advanced in a lifting direction, the y direction in this case, and the guidance means 11 mounted on it is lifted. An inserted server 3 is consequently moved toward the circuit board 6.

The circuit board 6 is used for electrically contacting inserted servers 3 with the connection module 9, which is arranged the rear area of the server frame 2 opposite from the front side 5. For this purpose, the circuit board 6 has plug connectors 7 complementary to the plug connectors 4 of the rack-mounted servers 3. The circuit board 6 extends in the xz plane, as does the upper side of the server 3 on which the plug connectors 4 are arranged. In the area of its rear edge in the z direction, the circuit board 6 has the plug connection 8 via which the connection modules 9 are contacted. For the sake of clarity, only one connection module 9 is illustrated in the example. Several connection modules 9 are typically present, which are used to provide supply voltages for the servers 3 and/or as interfaces, for example, to connect the serves 3 to a data network.

Figure 2:
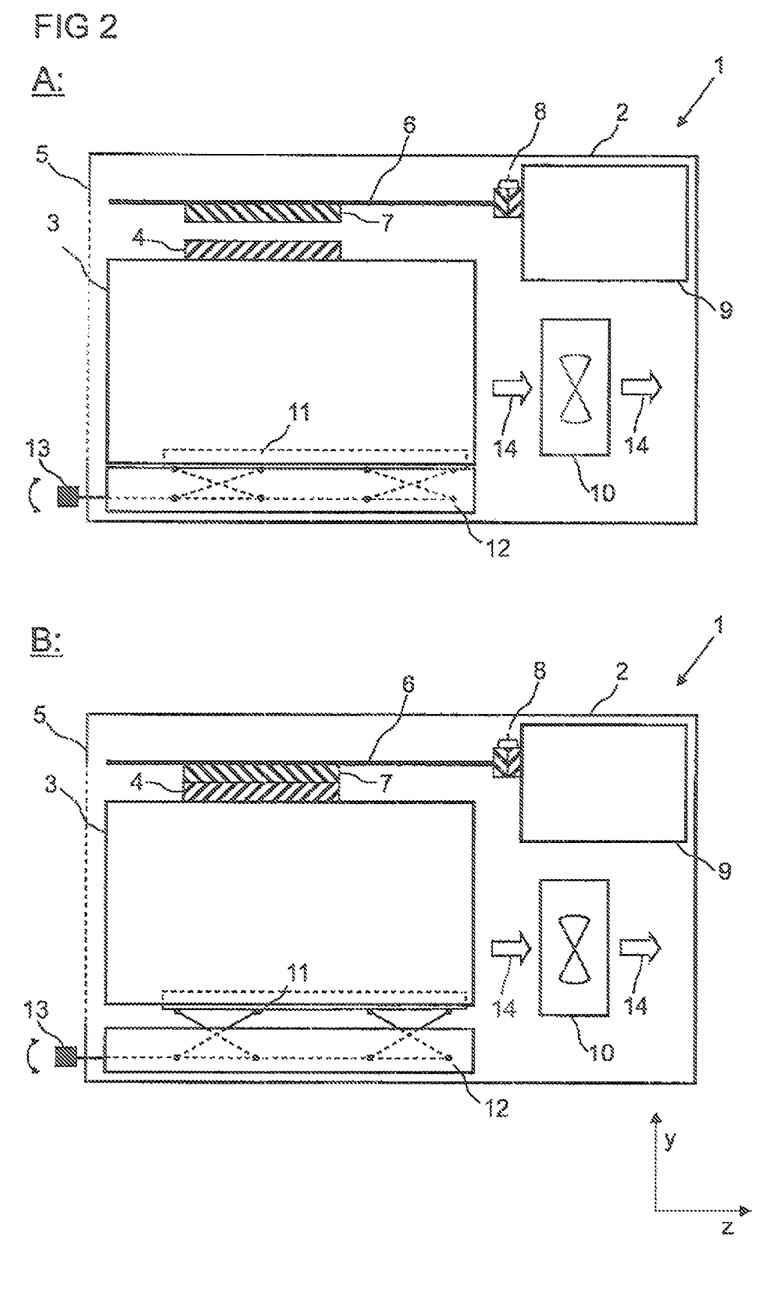
FIG. 2 shows a schematic sectional view of the server frame from FIG. 1.

FIG. 2 shows the server system of FIG. 1 in a schematic side view in the xy plane.

In the upper part A of FIG. 2, a server 3 inserted up to the predetermined position into the server frame 2 is shown with a lowered lifting device 12. The stop by which the predetermined position is defined is provided by the length of the groove in server 3 in which the dovetail tongue of the guidance means 11 engages. It is evident that, at the predetermined position, the plug connectors 4 and 7 face one another suitably in the z direction and (not visible in this representation) also in the x direction due to the position of the guidance means 11. By actuating the operating element 13, the lifting device 12 is then advanced so that the server 3 is moved in a lifting direction corresponding here to the y direction, toward the circuit board 6 and in parallel with it, and the plug connectors 4 and 7 of the server 3 and the circuit board 6 respectively are brought into contact.

The resulting situation is represented in the lower part B of FIG. 2. A rack-mounted server 3 can be removed from the server frame 2 in the opposite manner by lowering the lifting device 12, whereby the plug connectors 4 and 7 are separated and the rack-mounted server 3 can then be removed in the z direction. Due to the construction of the guidance means 11 as a dovetail tongue, which can transfer force in the positive and the negative y direction, the lifting device 12 functions in this case as a disconnection device for the plug connectors 4 and 7. It is alternatively possible to provide a separate disconnection device by which a rack-mounted server 3 can be moved downward after lowering the lifting device 12. Such a separate disconnection device can be formed, for example, by a correspondingly arranged lever, wedge or cam that presses on the upper side of the server 3. It is also possible to provide spring elements that exert a force onto the upper side of the server 3 downward toward the lifting device 12 when the plug connectors 4 and 7 are in contact. The plug connectors 4 and 7 are separated by this force when the lifting device 12 is lowered. When the server 3 is lifted via the lifting device 12, the spring elements are correspondingly tensioned.

As suggested in FIG. 2, the lifting device 12 is constructed as a scissor-type jack, so that a rotation of the operating element 13 lifts the guidance means 11 in the direction toward the circuit board 6 or lowers it away from the latter. Other designs are likewise possible. For example, the lifting device 12 can have a slide as the operating element 13 with a conversion mechanism being provided that converts a horizontal sliding movement into a vertical lifting movement. Such a conversion mechanism can be realized, for example, by inclined planes, wedges, levers or cams.

Blade servers are usually cooled by an air stream guided through them in the insertion direction z. The servers 3 constructed as blade servers have corresponding ventilation gratings, not shown in the figures, on their front and rear sides for this purpose.

No fans are typically provided in the servers 3 themselves. Instead, the fan modules 10 arranged in the server frame 2 are used to generate a cooling air stream 14 guided through the servers 3. As seen from FIG. 2, the cooling air stream 14 can run without hindrance through the server frame 2.

A known server system 1' is shown in FIG. 3. Identical elements bear identical reference numbers to those in the preceeding figures, while similarly functioning elements bear a reference character with the same number and a characterizing apostrophe.

The server system 1' has a server frame 2' into which rack-mounted servers 3' are inserted. The rack-mounted servers 3' have plug connectors 4'. A circuit board 6' is provided with plug connectors 7' that are complementary to the plug connectors 4' of the rack-mounted servers 3'. The circuit board 6' is connected by a plug connection 8' to an insertion module 9. A fan module 10 is used to generate a cooling air stream 14' to cool the rack-mounted server 3'.

As shown in FIG. 3, the circuit board 6' is arranged perpendicular to the insertion direction z of the server 3' between the rack-mounted servers 3' and the connection modules 9. As suggested by the position of the circuit board 6' in the server frame 2', such a circuit board 6' is usually referred to as a midplane. Openings for the cooling air stream 14' are provided in the circuit board 6' in the vicinity of the plug connectors 4' and 7'. It is evident that, due to the selected arrangement of the circuit board 6', the cooling air stream 14' can first not be guided unhindered through the server frame 2', and second the plug connectors 4' on the rear side of the rack-mounted server 3' compete with the air passage grating from the available space. The openings provided on the circuit board 6' also weaken the mechanical stability of the circuit board 6' and limit the space available for conductor traces on the circuit board 6'. This applies all the more since several plug connectors 4' are frequently provided near the upper or lower edge of the rack-mounted server 3' to allow any passage of air in the central area of the rack-mounted server 3' at all.

The space available for air passage openings on the circuit board 6' is thus limited and correspondingly air passage openings cannot be provided in a desired cross section, whereby there is inevitably a hindrance of the cooling air stream 14'. The advantage in this respect of my server frames 2 and insertion modules 3 over and against conventional systems are shown by the comparison of FIGS. 2 and 3. My server frame 2 can advantageously be designed such that typical connection modules 9 and fan 10 modules on the market can also be used in the server frame 2.

Figure 4:
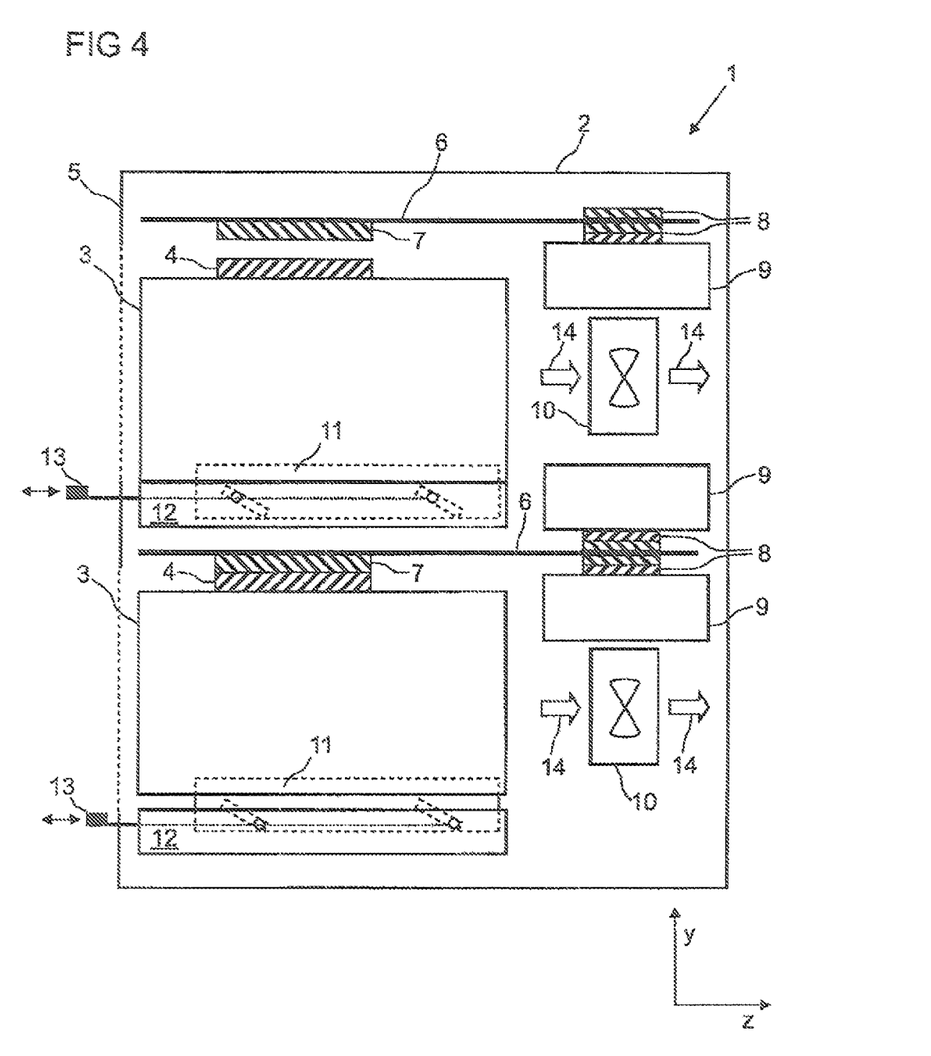
FIG. 4 shows a schematic sectional view of a server frame in a second example.

FIG. 4 shows a schematic sectional view of a server frame 2 in a second example. Identical reference numbers again mark elements that are identical or functionally identical to those in FIGS. 1 and 2.

Different from the example of FIGS. 1 and 2, rack-mounted servers 3 can be inserted on two levels into the server frame 2 illustrated here. Another difference relates to the configuration of the plug connection 8 between the circuit boards 6 and the connection modules 9. The latter are arranged here such that the insertion modules 9 are positioned above and below the circuit board 6, whereby the space behind the lifting device 12 in the z direction can be better utilized. The plug connectors 8 of the connection modules 9, which face one another on different sides of the circuit board 6, can be arranged offset in the x direction or the z direction.

The lifting device 12 is also constructed differently from the first example. As indicated in FIG. 4, the lifting device 12 has a sliding mechanism with obliquely arranged elongated holes. Correspondingly, the operating element 13 is not constructed as a rotary knob in FIGS. 1 and 2, but rather as a slider. The rack-mounted server 3 shown in the upper level is in the not-yet contacted, not-yet raised position, whereas the rack-mounted server 3 shown in the lower level is already shown in the operating position.

Figure 5:
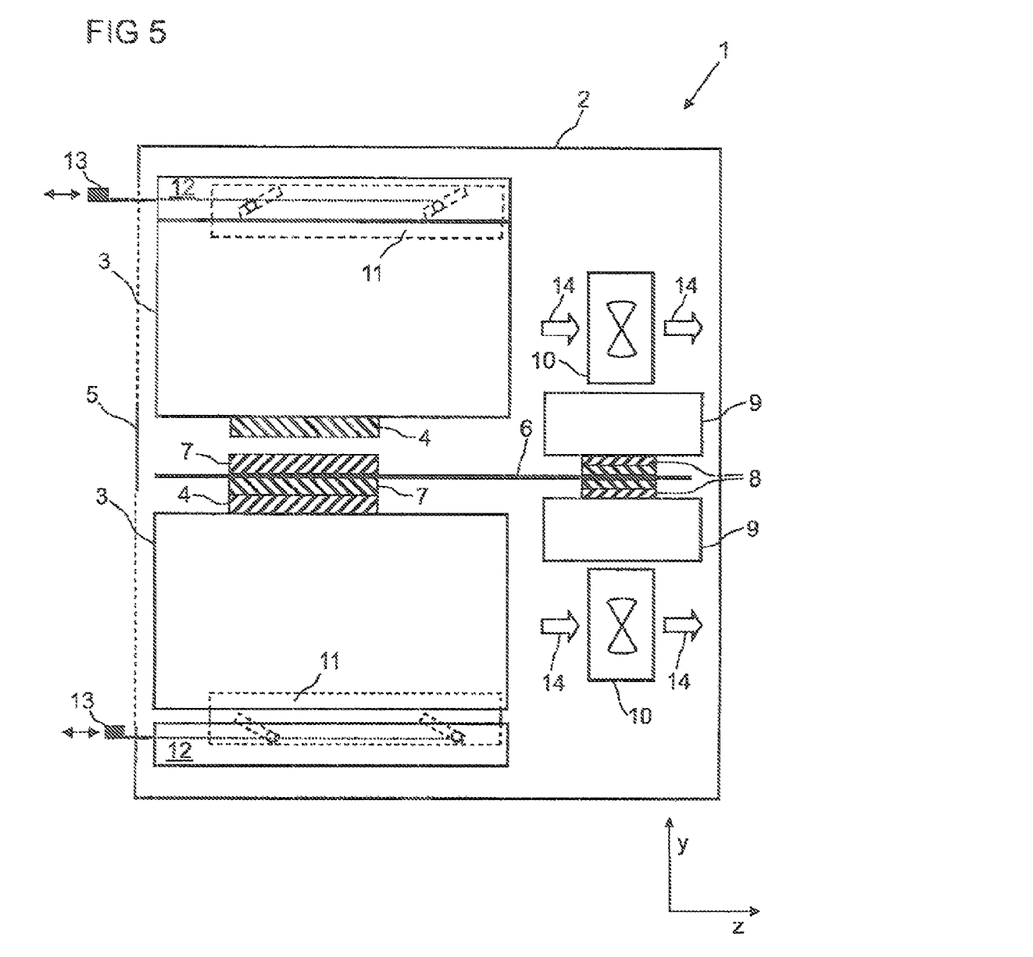
FIG. 5 shows a schematic sectional view of a server frame in a third example.

FIG. 5 shows a schematic sectional view of a server frame 2 according to a third example. Identical reference numbers again mark elements that are identical or functionally identical to those in FIGS. 1, 2 and 4.

Similar to the example shown in FIG. 4, space is also provided in the server frame 2 for the rack-mounted servers 3 in two levels. The rack-mounted server 3 in the upper level is again shown in the not-yet contacted state, whereas the rack-mounted server 3 in the lower level is shown already contacted and ready for operation.

Unlike the previously shown example, only one circuit board 6 is provided, which is arranged vertically in the server frame 2 roughly in the center between the two levels. The circuit board 6 is used to contact rack-mounted servers 3 in both levels. The circuit board 6 has plug connectors 7 on both sides for this purpose. The plug connectors 7 of insertion spaces that face one another in pairs on different sides of the circuit board 6 can also be arranged offset in the x direction or the z direction. An offset in the x direction, wherein the complementary plug connectors 4 of the rack-mounted servers 3 are arranged offset from one another in the x direction on the rack-mounted servers 3, is particularly advantageous. In such a configuration, the same rack-mounted servers 3 can be used in the lower level and the upper level, but upside-down in the latter case.

Corresponding to the inverted lifting direction y for contacting, the lifting device 12 in the upper level is designed to be mirror symmetric with respect to that in the lower level. The guidance means 11 is advantageously positively engaged in the positive and negative y directions, for example, as a dovetail tongue, as previously described.

The invention claimed is:

1. A server system comprising:
    at least one blade server, wherein the blade server has at least one processor and memory modules, as well as a plug connector on an upper side or an underside of the blade server;
    a server frame with an opening on a first side of the server frame accommodates the at least one blade server, wherein the first side is spanned by a first direction and a lifting direction perpendicular to the first direction, wherein the server frame comprises:
        a guide that fixes the at least one blade server in the first direction and guides the at least one blade server up to a predetermined position in an insertion direction perpendicular to the first side of the server frame,
        a circuit board that contacts the at least one blade server inserted from the first side of the server frame in the insertion direction, wherein the circuit board is arranged perpendicular to the lifting direction and has at least one plug connector that is complementary to the plug connector of the blade server, and wherein the plug connector of the blade server and the plug connector of the circuit board face one another in the lifting direction at the predetermined position, and
        a lifting device that guides the at least one blade server in the lifting direction up to the circuit board;
    at least one cooling fan assembly arranged inside the server frame that is set up to blow or draw in cooling air in the insertion direction through the at least one blade server; and
    a dovetail arranged as a guide on the lifting device in the server frame and a correspondingly shaped groove located in the underside of the at least one blade server, and the dovetail and the groove are not formed over the entire depth of an installation space or the server so that a front side of the dovetail constitutes a stop that allows an insertion of the blade server only up to a predetermined position in the insertion direction.

2. The server system according to claim 1, wherein the server frame has several insertion spaces for blade servers along the first direction.

3. The server system according to claim 2, wherein fan modules are arranged in the server frame behind the insertion spaces in the insertion direction.

4. The server system according to claim 2, wherein insertion spaces for the blade servers are arranged in two levels in the server frame, the circuit board is arranged between the levels and plug connectors are provided on both sides of the circuit board.

5. The server system according to claim 1, wherein the lifting device is set up such that the plug connector of the inserted blade server and the plug connector of the circuit board are connected when the lifting device is actuated.

6. The server system according to claim 1, wherein the server frame has a separation device that moves the at least one blade server away from the circuit board and breaks a connection between the plug connector of the at least one blade server and the at least one plug connector of the circuit board.

7. The server system according to claim 1, in which the guide fixes the inserted blade server in the lifting direction and the lifting device also serves as a separation device.

8. The blade server for insertion into the server system according to claim 1, wherein the blade server comprises at least one processor and memory modules, and has ventilation gratings on a front side and a rear side for drawing in or blowing cooling air through the blade server in the insertion direction of the blade server in the server system, and at least one plug connector on an upper side or an underside of the blade server arranged parallel to the insertion direction for electrically contacting the complementary plug connector of the circuit board.

9. The server system according to claim 1, wherein the at least one blade server has ventilation gratings on a front side and a rear side of the blade server.

10. A server system comprising:
  at least one blade server, wherein the blade server has at least one processor and memory modules, as well as a plug connector on an upper side or an underside of the blade server;
  a server frame with an opening on a first side of the server frame accommodates the at least one blade server, wherein the first side is spanned by a first direction and a lifting direction perpendicular to the first direction, wherein the server frame comprises:
    a guide that fixes the at least one blade server in the first direction and guides the at least one blade server up to a predetermined position in an insertion direction perpendicular to the first side of the server frame,
    a circuit board that contacts the at least one blade server inserted from the first side of the server frame in the insertion direction, wherein the circuit board is arranged perpendicular to the lifting direction and has at least one plug connector that is complementary to the plug connector of the blade server, and wherein the plug connector of the blade server and the plug connector of the circuit board face one another in the lifting direction at the predetermined position, and
    a lifting device that guides the at least one blade server in the lifting direction up to the circuit board, wherein the lifting device is coupled to an operating element accessible from the front side in the server frame, and the lifting device in the server frame is constructed as a scissor-type jack, so that a rotation of the operating element lifts the guide in the direction toward the circuit board or lowers it away from the latter; and
  at least one cooling fan assembly arranged inside the server frame that is set up to blow or draw in cooling air in the insertion direction through the at least one blade server.

11. The server system according to claim 10, wherein the at least one blade server has ventilation gratings on a front side and a rear side of the blade server.

12. The server system according to claim 10, wherein the server frame has several insertion spaces for blade servers along the first direction.

13. The server system according to claim 12, wherein fan modules are arranged in the server frame behind the insertion spaces in the insertion direction.

14. The server system according to claim 12, wherein insertion spaces for the blade servers are arranged in two levels in the server frame, the circuit board is arranged between the levels and plug connectors are provided on both sides of the circuit board.

15. The server frame according to claim 10, wherein the lifting device in the server frame is set up such that the plug connectors of an inserted blade server and of the circuit board are connected when it is actuated.

16. The server system according to claim 10, wherein the server frame has a separation device that moves that at least one blade server away from the circuit board and breaks a connection between the plug connectors of the at least one inserted blade server and the circuit board.

17. The server system according to claim 10, in which the guide fixes an inserted blade serve in the lifting direction and the lifting device is set up so that it also serves as a separation device.

18. A blade server for insertion into a server system with a server frame according to claim 10, wherein the blade server comprises at least one processor and memory modules, ventilation gratings on a front side and a rear side of the blade server for drawing in or blowing cooling air through the blade server in an insertion direction of the blade server in the server system, and at least one plug connector on an upper side or an underside of the blade server arranged parallel to an insertion direction for electrical contracting with a complementary plug connector of a circuit board of a server frame.

* * * * *